United States Patent [19]
Kato et al.

[11] Patent Number: 4,764,396
[45] Date of Patent: Aug. 16, 1988

[54] METHOD FOR PREVENTING ALUMINUM CORROSION IN ELECTRONIC PARTS

[75] Inventors: Hideki Kato, Kuwana; Noriyuki Yamamoto, Okazaki, both of Japan

[73] Assignee: Toagosei Chemical Industry Co., Ltd., Tokyo, Japan

[21] Appl. No.: 100,592

[22] Filed: Sep. 24, 1987

[30] Foreign Application Priority Data

Oct. 3, 1986 [JP] Japan .................. 61-234487

[51] Int. Cl.$^4$ .................. B05D 5/06; H01G 9/00; C23F 11/00
[52] U.S. Cl. .................. 427/69; 427/58; 422/8; 361/433
[58] Field of Search .................. 361/433, 323, 380; 29/570.1; 106/14.05; 422/7, 17, 8; 427/69, 58

[56] References Cited

U.S. PATENT DOCUMENTS

| | | | |
|---|---|---|---|
| 1,933,302 | 10/1933 | Aurand | 422/8 X |
| 2,895,270 | 7/1959 | Blaess | 422/8 X |
| 2,986,447 | 5/1961 | Raifsnider | 422/8 |
| 3,585,468 | 6/1971 | Chertok et al. | 361/323 |
| 3,775,057 | 11/1973 | Redmore | 422/7 |
| 4,105,405 | 8/1978 | Wehle et al. | 422/17 |
| 4,169,271 | 9/1979 | Saitoh | 361/433 X |
| 4,672,506 | 6/1987 | Deguchi et al. | 361/323 |

FOREIGN PATENT DOCUMENTS

| | | | |
|---|---|---|---|
| 91998 | 5/1986 | Japan | 106/14.05 |
| 657105 | 4/1979 | U.S.S.R. | 422/8 |

*Primary Examiner*—Donald A. Griffin
*Attorney, Agent, or Firm*—Wyatt, Gerber, Shoup and Badie

[57] ABSTRACT

A method for preventing aluminum corrosion in electronic parts which comprises adding lead hydroxy apatite and/or cadmium hydroxy apatite to constituents of the electronic parts through which halogen ions pass, so that said ions may be captured by said apatites in said constituents.

6 Claims, 2 Drawing Sheets

METHOD FOR PREVENTING ALUMINUM CORROSION IN ELECTRONIC PARTS

The present invention relates to a process for preventing the corrosion of aluminum portions of the parts employed in the field of the electronic industry.

Failure of the electronic appliances is caused primarily by corrosion of such portions as wirings and electrodes of their parts.

Aluminum is employed as a material of various portions of electronic parts such as electrodes of aluminum electrolytic capacitors and wirings of integrated circuits, semiconductors and the like.

It is well known that aluminum corrosion is promoted in the presence of ionizable impurities, particularly halogen ions such as chlorine, bromine and fluorine.

Those impurities come from various sources, for example, air, resinous package materials for protective insulation such as epoxy resin, phenol resin, silicone resin and polyphenylene sulfide resin, inorganic fillers, and solvents such as halogenated hydrocarbon including ethane trichloride, trichloroethylene and tetrachlorodifluoroethane. The halogenated hydrocarbon solvents are used in the manufacture of aluminum electrolytic capacitors in order to remove soldering flux from a printed circuit board after it has been soldered. However, such solvents often intrude into the inside of electronic devices and then decompose and remain therein as halogen ions.

Various attempts to exclude those impurities have been made by preliminarily refining raw materials or by providing a device with a structure which can prevent the above solvents intruding thereinto.

For example, raw materials for sealing an integrated circuit have been washed with boiled hot water or treated by alkali to decrease residual halogen ions. However, after the washing or the alkali treatment, a minor amount of halogen ions still remain in the raw materials.

Further, some aluminum electrolytic capacitors have been provided at their sealing portions with build-up of resin or with a sheet attachment so as to prevent the intrusion of chlorinated hydrocarbon solvents. (Japanese published unexamined patent application Nos. 59316/82, 73928/82, 13233/82, 151013/83 and 151014/83 are incorporated herein by references.)

However, the above techniques have a disadvantage that they make the manufacturing process of electronic devices complicated and thus require much more energy, personnel and cost.

A process has also been proposed wherein halogen ions-adsorbing agents are added to such raw materials as described above. However, in general, most halogen ions-adsorbing agents are effective on the acid side, particularly at a pH value of 3 or less. No agents which selectively and effectively adsorb halogen ions at a higher pH value, have been proposed.

Inorganic hydrous oxide materials which adsorb halogen ions, such as hydrous titanium oxide, hydrous zirconium oxide, etc., have the same disadvantages as of the above halogen ions-adsorbing agents. Furthermore, those hydrous oxide materials cannot practically be used for aluminum electrolysis capacitors since they selectively adsorb phosphate ions rather than halogen ions when both are coexistent.

A process for sealing aluminum wherein lead phosphates or other salts are added to a sealing material which primarily comprises epoxy resin so that both cathode and anode of aluminum can be passivated by anion and cation both of which result from dissociation of the salts, has also been proposed.

However, this process has the disadvantage that the dissociated free ions increase the electrical conductivity of sealing materials which should have been kept low, particularly at a high temperature as shown later in comparative example 1.

Meanwhile, it should be noted that the above lead phosphate is completely different in structure and function from the lead hydroxy apatite used in the present invention.

In general, mechanism of aluminum corrosion is explained by the following reactions (refer to W. M. Paulson, R. P. Logigan, Rel. phys. Proc., 14, 42 (1976)):

The reaction of haloqen ion and moisture as an anode reaction:

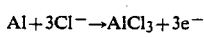
$$Al + 3Cl^- \rightarrow AlCl_3 + 3e^-$$

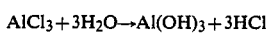
$$AlCl_3 + 3H_2O \rightarrow Al(OH)_3 + 3HCl$$

$$Al(OH)_3 + Cl^- \rightarrow Al(OH)_2Cl + OH^-$$

The reaction of alkali ion and moisture:

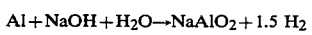
$$Al + NaOH + H_2O \rightarrow NaAlO_2 + 1.5\ H_2$$

As a cathode reaction:

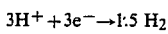
$$3H^+ + 3e^- \rightarrow 1.5\ H_2$$

As described above, the conventional methods for preventing the aluminum corrosion which causes failure of electronic parts, that is, the method wherein raw package materials and the like are refined, the method which comprises providing a device with a structure which prevents ionizable impurities from intruding into a device and the method using ion capturing agents, cannot be satisfactorily used since they all suffer from their disadvantages described above.

It is an object of the present invention to provide a method which effectively and readily prevents the aluminum corrosion in electronic devices on the industrial scale without preliminarily removing the impurities from the raw materials or without any structure which prevents the intrusion of the solvents even when ionizable impurities are present in the materials or the devices.

It is another object of the present invention to provide a method for preventing aluminum corrosion which is suitable for use in IC sealing materials and aluminum electrolysis capacitors.

As a result of the intensive research on agents which capture ionizable impurities, particularly halogen ions, the present inventors have found out that lead hydroxy apatite and cadmium hydroxy apatite selectively capture halogen ions and effectively prevent the aluminum corrosion in electronic devices.

According to the present invention, there is provided a method for preventing aluminum corrosion in electronic parts wherein lead hydroxy apatite and/or cadmium hydroxy apatite are added to constituents of an electronic part through which halogen ions pass, so that said ions may be captured by said apatites in said constituents.

CONSTITUENTS IN WHICH LEAD AND/OR CADMIUM HYDROXY APATITES ARE CONTAINED

The constituents of an electronic part in which said lead hydroxy apatite and/or cadmium hydroxy apatite are made present according to the present invention, include protective package materials, that is, insulation protective materials employed for protecting devices, contacts, etc. of electronic parts which have such a function as semiconducting function, dielectric function, magnetic function, insulation function and coloring or decoloring function, for example, diode, transistor, varistor, capacitor, liquid crystal, thermistor, integrated circuit and large scale integration. More specifically, the constituents are, what we call, sealing materials, casting materials, encapsulation materials, potting materials, layer-to-layer retaining materials, junction coat materials, passivation materials, dipping materials, sealing materials, roller coating materials, drip coating materials and the like. Examples of constituents of the aluminum electrolytic capacitor are sealing materials made from rubber, electrolytic solution consisting of an electrolyte and an organic solvent, electrolytic papers and electrodes.

For reference, a structure of the sealing of an integrated circuit and a structure of an aluminum electrolytic capacitor are shown as examples in FIGS. 1–3.

Figure 4A:
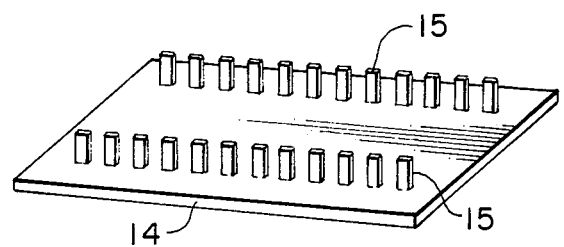

FIGS. 4(a) and (b) are schematic perspective views of a typical printed board used in the examples and the comparative examples described later.

Figure 1:
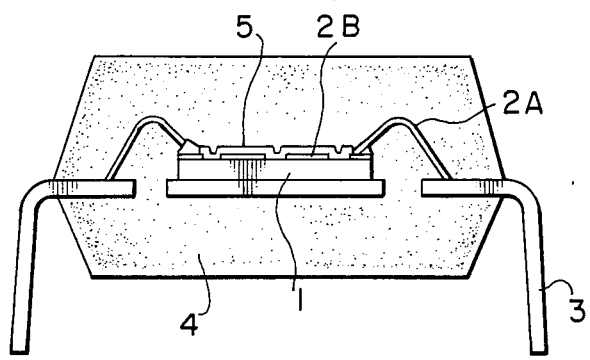
FIG. 1 is a schematic elevational view of a typical package of such a device as an integrated circuit sealed with a package material.

In FIG. 1, the numeral 1 indicates an integrated circuit, the numeral 2A, bonding wire, the numeral 2B, an aluminum wiring, the numeral 3, an electrode pin, the numeral 4, sealing material, and the numeral 5, passivation layer. The sealing material 4 which packages the other elements, may contain therein the lead and/or cadmium hydroxy apatites in accordance with the present invention.

Figure 2:
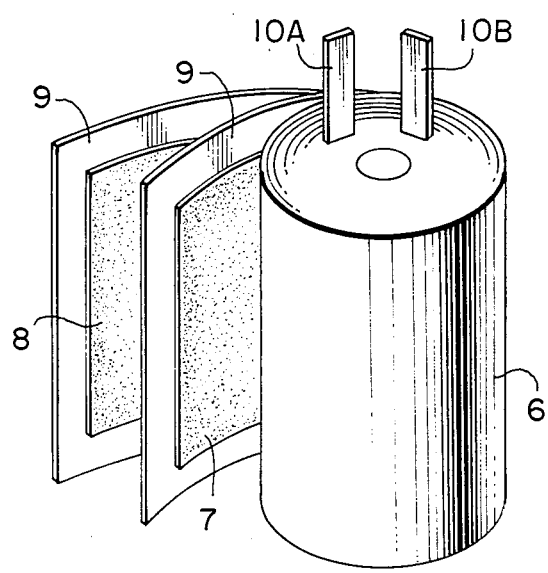
FIG. 2 is a schematic perspective view of the body of a typical aluminum electrolytic capacitor.
Figure 3:
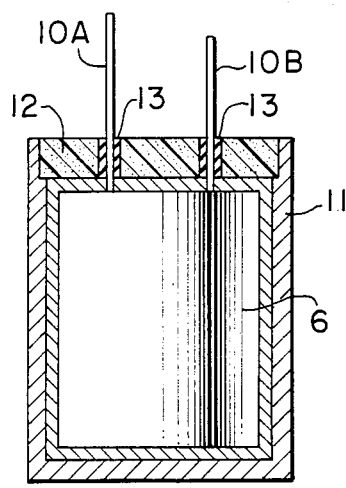
FIG. 3 is a schematic elevational view of an aluminum electrolytic capacitor which accommodates and seals the body of FIG. 2 in a container.

In FIG. 2, the numeral 6 generally indicates the body of an aluminum electrolytic capacitor, and the numeral 7 indicates an aluminum oxide film as an anode, the numeral 8, an electrical conductive metal film as a cathode, the numeral 9, an electrolytic paper, and the numerals 10A and 10B, lead wires for the electrodes. In FIG. 3, the numeral 11 indicates a container which accommodates and protects the body 6, the numeral 12, a sealing material, and the numeral 13, rubber rings which are not always necessary. The electrolytic paper 9, the sealing material 12 and the rubber rings 13 may contain therein the lead and/or cadmium hydroxy apatites in accordance with the present invention.

In FIGS. 4(a) and (b), the numeral 14 indicates a substrate, the numeral 15, aluminum electrodes, and the numeral 16, a resin which is applied to the substrate 14 so as to embed about half the height of the electrodes 15 in the resin 16. The resin 16 may contain therein the lead, and/or cadmium hydroxy apatites in accordance with the present invention.

LEAD HYDROXY APATITE AND CADMIUM HYDROXY APATITE

Lead hydroxy apatite and cadmium hydroxy apatite generally have the following stoichometric composition:

$$M_{10}(ZO_4)_6(OH)_2 \cdot nH_2O$$

wherein M is Pb or Cd and Z is such a pentavalent element as P, As, V and the like.

In the present invention, the composition is defined as that having an apatite crystalline structure of the hexagonal system $P6_3/m$ and a molar ratio of M to Z of 1.5 to 1.67, although the molar ratio is stoichometrically 1.67. Such apatites of alkaline-earth metals as $Ca_{10}(PO_4)_6(OH)_2$, $Sr_{10}(PO_4)_6(OH)_2$ and $Ba_{10}(PO_4)_6(OH)_2$ are well known as hydroxy apatites.

Extensive investigations have been made on ion-exchangeability of those alkaline-earth metal apatites. However, they are quite inferior in halogen-ion adsorption to the lead hydroxy apatite and the cadmium hydroxy apatite in the neighborhood of the neutral.

Although the amount of the lead and/or cadmium hydroxy apatites contained in a constituent of the electronic parts is not limited, it is preferably 0.1–10% by weight based on the constituent.

If the amount is 0.1% by weight or more, the ion-capturing effect can be effectively attained. Although the upper limit of the amount may be determined within the range where the inherent function of the constituent used is not lost, it is generally 10% by weight. If the amount is less than 0.1% by weight, the capture of halogen ion is not sufficiently effected. If the amount is more than 10% by weight, the insulation of electronic parts will be harmed.

The amount of the apatites used in liquid constituents of electronic parts is generally less than that used in solid constituents.

In the present invention, cation exchangers which adsorb such a cation as sodium ion, for example, antimonic acid, zirconium phosphate and titanium phosphate, may be used together with the lead hydroxy apatite and/or the cadmium hydroxy apatite.

METHOD FOR ADDING LEAD AND/OR CADMIUM HYDROXY APATITES TO THE CONSTITUENTS OF ELECTRONIC PARTS

In order to make lead and/or cadmium hydroxy apatite present in package materials or sealing portions of aluminum electrolytic capacitors, there may be employed a method which has conventionally been used to mix thermoplastic resins, synthetic rubbers, thermosetting resins, and photo-, electromagnetic- or electron-curing resins with inorganic fillers such as white carbon, fused silica, etc.

In order to uniformly disperse lead and/or cadmium hydroxy apatites in an electrolytic solution such as that of an aluminum electrolytic capacitor in which an electrolyte is dissolved in an organic solvent such as N,N-dimethylformamid and ethylene glycol, dispersants may be used.

In order to make lead and/or cadmium hydroxy apatites present in a paper-like material such as an electrolytic paper of an aluminum electrolytic capacitor, the apatites may be mixed with paper materials when the paper is being manufactured. Alternatively, an electrolytic paper may be impregnated with an aqueous solution of lead and/or cadmium salts such as lead nitrate, cadmium nitrate and the like as a material of their hydroxy apatites, and then treated by a suitable reaction wherein phosphoric acid and an alkali are brought into contact with the paper to produce therein the lead and/or cadmium apatites.

Alternatively, the lead and/or cadmium hydroxy apatites may be coated to electrolytic papers or electrodes in the form of a coating composition.

FUNCTION OF LEAD AND/OR CADMIUM HYDROXY APATITES

The lead and/or cadmium hydroxy apatites used in the present invention adsorb halogen ions by the following ion-exchange reaction:

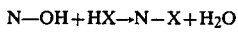

wherein N—OH is lead hydroxy apatite or cadmium hydroxy apatite, and X is halogen ion.

EXAMPLES

Hereinafter, the present invention will be more specifically set forth with reference to examples and comparative examples. In the following examples, '%' means % by weight and 'part' means part by weight unless otherwise indicated.

EXAMPLE 1, AND COMPARATIVE EXAMPLES 1 AND 2

Prepared were 1663 grams of a 10% aqueous solution of lead nitrate and 1663 grams of an aqueous solution containing 143 grams of trisodium phosphate dodecahydrate and 5.6 grams of sodium hydroxide. And both solutions were simultaneously added at a rate of 200 grams/hour to a 5-liter four neck flask which contained 833 grams water therein.

During this reaction, the temperature was kept at 38°±3° C. After the addition had been finished, the mixture was aged for seven days at the same temperature as the above.

Thereafter, the mixture was filtered and washed with water, and was then dried at 105° C. for 4 hours to obtain 106 grams of a lead hydroxy apatite product.

A chemical analysis revealed that the product had the molar ratio of Pb to $PO_4$ of 1.60. From the X-ray chart, the product was found to have an apatite structure. The lattice constant of the product was found to be a=9.85 and c=7.22, which was the same as that indicated in a reference, Acta chimica Acade mae ρ cientiarum Hungaricae, Tomus 91 (3), page 321–326, (1976).

The product was used as a sample in Example 1. The above reaction is shown as follows:

Next, lead pyrophosphate was synthesized as lead polyphosphate as follows.

To 600 ml of an aqueous solution containing 33 grams of lead nitrate, were added an aqueous solution containing 11.5 grams of potassium pyrophosphate for one hour. The temperature was kept at 50° C. during the reaction, and then the reaction solution was aged at the same temperature for 30 minutes. The solution thus obtained had pH of 4.2.

Thereafter, the solution was filtered and washed with water, and then dried at 105° C. for 4 hours to obtain 19 grams of powdered lead pyrophosphate.

This product was used as a sample in comparative example 1.

A chemical analysis revealed that the powder thus obtained had a molar ratio of Pb to $P_2O_5$ of 1.95 which was substantially the same as the theoretical value of 2. A x-ray diffraction analysis revealed that this product had a different structure from an apatite and was not so good in crystallinity.

Five parts each of the lead hydroxy apatite and the lead pyrophosphate thus obtained were added to and mixed with each sealing material which consisted of 20 parts of cresol-novolac epoxy resin having epoxy equivalent of 228, 10 parts of phenol-novolac resin having hydroxyl equivalent of 104, 65 parts of fused silica, 2 parts of a flame retardant consisting of antimony trioxide and brominated epoxy resin, and a minor amount of an amine curing catalyst (example 1 and comparative example 1).

The above epoxy resin had 400 ppm of hydrolyzed chlorine and 10 ppm of free chlorine.

In addition, a sealing material which had none of lead hydroxy apatite and lead pyrophosphate, was prepared (comparative example 2).

Each of the cured materials was ground in the ordinary way and then passed through a 100 mesh sieve. Each of the passed materials was tested in accordance with the boiling water extraction test. That is, the ionic impurities in each of the passed materials were extracted into pressurized water at 121° C. for 24 hours. These water sample after extraction, were examined. The results are shown in Table 1.

TABLE 1

| Example or comparative example | Additive | pH | $Cl^-$ (ppm) | Electrical conductivity (μs/cm) |
|---|---|---|---|---|
| Example 1 | lead hydroxy apatite | 4.8 | 8 | 7 |
| Comparative example 1 | lead pyrophosphate | 2.7 | 40 | 140 |
| Comparative example 2 | none | 3.8 | 35 | 130 |

It is apparent from Table 1 that $Cl^-$ ions were captured in Example 1 well, but not in comparative example 1. And the Table 1 also shows that comparative example 1 had the highest electrical conductivity, which is considered to result from the presence of free $P_2O_7^{4-}$ or its hydrolyzed product $PO_4^{3-}$. It is understood that the use of lead pyrophosphate makes insulation resistance worse at a heated condition.

EXAMPLE 2, AND COMPARATIVE EXAMPLES 3 AND 4

As a test model for determining the corrosion of aluminum electrodes, were used a printed board which is provided at intervals of 5 mm with unconnected aluminum pins having aluminum purity of 99.99% or more, as shown in FIG. 4(a).

Figure 4B:
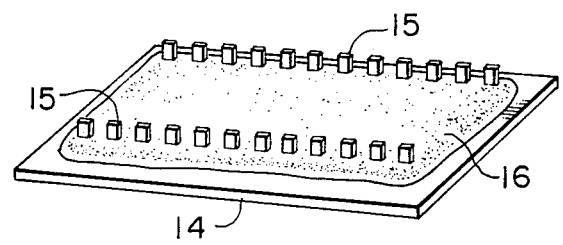

Each of the sealing materials used in the example 1 and the comparative examples 1 and 2 was applied to each printed board to cover half the height of the pins (FIG. 4(b)). The sealing materials were cured in the ordinary way.

The 24 pins were alternately set as + and − electrodes.

Pressure cooker tests (Bias-Moisture Life test in a pressure cooker vessel) were conducted using the above sealed boards under 2 atm. at 121° C. while applying 20 volts to the electrodes.

After 500 hours, each model was immersed in methylethylketone to remove the above-applied epoxy resin. And then, electrode corrosion of each model was observed.

The results were shown in Table 2.

TABLE 2

| Example or comparative example | Additive | Percentage of corroded aluminum electrodes to all the electrodes | |
|---|---|---|---|
| Example 2 | lead hydroxy apatite | (0/24) | 0% |
| Comparative example 3 | lead pyrophosphate | (16/24) | 66.7% |
| Comparative example 4 | none | (15/24) | 62.5% |

It will be seen from Table 2 that lead hydroxy apatite has a great positive effect on the prevention of corrosion of aluminum electrodes, compared with the models to which lead pyrophosphate or no additive was added.

EXAMPLE 3 AND COMPARATIVE EXAMPLES 5-10

Various other types of metal hydroxy apatites were prepared in the same conditions as in Example 1 except for using Cd, Ca, Sr, Mg, Ba and Zn nitrates in place of lead nitrate.

X-ray diffraction analyses showed that all these products had apatite structures.

Two parts of each product was mixed with 100 parts of each isobutylene butadiene rubber by use of roll blending process to prepare each rubber sealing material.

Each rubber composition of the sealing materials was applied to each printed board so as to cover about half the height of the aluminum pins as done in Example 2.

These models were immersed in trichloroethylene and cleaned with 30 KHz ultrasonic wave for 30 minutes.

The 24 pins were alternately set as + and − electrodes in the same manner as in Example 2.

Tests under a high-temperature and high-humidity condition were then conducted by allowing the models to stand at 85° C. and at 85% RH while 10 voltage was being applied to the electrodes of the models.

After 500 hours and 1000 hours, corrosion of each aluminum electrode was observed (Example 3 and comparative examples 5-9).

The same test was conducted using a model in which no apatite was employed (comparative example 10).

The results are shown in Table 3.

TABLE 3

| Example or comparative example | Additive (Type of apatite) | Percentage of corroded aluminum electrodes to all the electrodes | | | |
|---|---|---|---|---|---|
| | | 500 hrs after | | 1000 hrs after | |
| Example 3 | Cd | (0/24) | 0% | (1/24) | 4% |
| Comparative example 5 | Ca | (11/24) | 46% | (21/24) | 88% |
| Comparative example 6 | Sr | (10/24) | 42% | (20/24) | 83% |
| Comparative example 7 | Mg | (10/24) | 42% | (22/24) | 92% |
| Comparative example 8 | Ba | (12/24) | 50% | (21/24) | 88% |
| Comparative example 9 | Zn | (11/24) | 46% | (22/24) | 92% |
| Comparative example 10 | none | (13/24) | 54% | (22/24) | 92% |

It is understood from Table 3 that cadmium hydroxy apatite has a great positive effect on the prevention of corrosion of aluminum electrodes, compared with alkaline-earth metal hydroxy apatites such as calcium hydroxy apatite and zinc hydroxy apatite.

EXAMPLE 4 AND COMPARATIVE EXAMPLES 11-13

In commercial N,N-dimethylformamide which is used as an electrolyte solvent, was dissolved boric acid to obtain a 10% solution. The solution was then saturated with diammonium phosphate.

Further, ammonium chloride was added to the solution so that the solution contained 100 ppm of chlorine.

To each 100 grams of the electrolyte solution thus obtained, were added 0.5, 1, 1.5 and 2 grams of each of the hydroxy apatites as used in Examples 1 and 3 and Comparative Example 5. After standing for one night, each of the solutions was filtered with a 0.4-micron precision filter. And amounts of residual chlorine of the filtered solutions were determined by the turbidimetric process using silver chloride (Examples 4 and 5 and Comparative Example 11).

On the other hand, the same tests were conducted in the same manner as described above except for using commercial hydrous titanium oxide and hydrous zirconium oxide in place of the above apatites (Comparative Examples 12 and 13).

The results are shown in Table 4

TABLE 4

| Example or comparative example | Additive | Residual chlorine amount (ppm) amount of additive (g) | | | | |
|---|---|---|---|---|---|---|
| | | 0 | 0.5 | 1 | 1.5 | 2 |
| Example 4 | lead hydroxy apatite | 100 | 60 | 37 | 16 | 7 |
| Example 5 | cadmium hydroxy apatite | 100 | 55 | 35 | 14 | 8 |
| Comparative example 11 | calcium hydroxy apatite | 100 | 99 | 100 | 101 | 99 |
| Comparative example 12 | hydrous titanium oxide | 100 | 101 | 98 | 100 | 99 |
| Comparative example 13 | hydrous zirconium oxide | 100 | 100 | 99 | 99 | 100 |

It is understood from Table 4 that lead hydroxy apatite and cadmium apatite capture chlorine ions which promote aluminum corrosion, better than the other materials.

We claim:

1. A method for preventing aluminum corrosion in electronic parts, which comprises adding lead hydroxy apatite and/or cadmium hydroxy apatite to constituents of the electronic parts.

2. A method according to claim 1 wherein said constituents of an electronic part are sealing materials, casting materials, encapsulation materials, potting materials, layer-to-layer retaining materials, junction coat materials, dipping materials, sealing materials, roller coating materials, or drip coating materials used for electronic devices.

3. A method according to claim 1 wherein said constituents of an electronic parts are a sealing material, an electrolytic paper, an electrolytic solution or electrodes used for aluminum electrolytic capacitors.

4. A method according to claims 1 to 3 wherein 0.1–10% by weight of said apatite based on said constituent is made present in the constituent.

5. A method according to claim 1 which prevents the corrosion of aluminum electrodes of said electronic devices.

6. A method according to claim 1 which prevents the corrosion of aluminum wirings of said electronic devices.

* * * * *